United States Patent [19]
Yoshino

[11] Patent Number: 5,504,349
[45] Date of Patent: Apr. 2, 1996

[54] OPTOELECTRONIC DEVICE

[75] Inventor: Takashi Yoshino, Tokyo, Japan

[73] Assignee: NEC Corporation, Tokyo, Japan

[21] Appl. No.: 290,503

[22] Filed: Aug. 15, 1994

[30] Foreign Application Priority Data

Aug. 13, 1993 [JP] Japan .................................. 5-201337

[51] Int. Cl.$^6$ ...................... H01L 29/41; H01L 31/0224; H01L 31/16
[52] U.S. Cl. .............................. 257/82; 257/81; 257/773; 257/775; 257/697
[58] Field of Search ............................... 257/81, 82, 773, 257/775, 697

[56] References Cited

U.S. PATENT DOCUMENTS 4,768,070  8/1988  Takizawa .................................. 257/82

FOREIGN PATENT DOCUMENTS 2-86184  3/1990  Japan .

Primary Examiner—Jerome Jackson, Jr.
Attorney, Agent, or Firm—Young & Thompson

[57] ABSTRACT

An optoelectronic device containing a base plate, a first lead fixed to the base plate, a first bonding face for a light-emitting element fixed to the base plate and a second bonding face for a light-receiving element fixed to the base plate. The first and second bonding faces orient different directions. A top end part of the first lead protruding form the base plate has a third bonding face parallel to the first bonding face and a fourth bonding face parallel to the second bonding face. Each end of a first piece of bonding wire is bonded to the first bonding face and the third bonding face. Each end of a second piece of bonding wire is bonded to the second bonding face and the fourth bonding face. The wire bonding processes of the first and second pieces of bonding wire are performed between the parallel bonding faces, respectively, producing sufficient bonding reliability.

11 Claims, 5 Drawing Sheets

OPTOELECTRONIC DEVICE

BACKGROUND OF THE INVENTION

1. Field of the Invention

The present invention relates to an optoelectronic device and more particularly, to an optoelectronic device having an optical element such as a laser diode, photodiode mounted on a body with leads.

2. Description of the Prior Art

A conventional optoelectronic device of this sort is shown in FIGS. 1A and 1B.

As shown in FIG. 1A, the conventional optoelectronic device has a metal stem composed of a circular metal plate 21 as a base and a metal block 34 as an element mount plate on the top surface of the plate 21. The block 34 is fixed on the metal plate 21 or is integrated with the plate 21. The block 34 has a horizontal cross-section of an arc and a flat element-mount face 34a at one side thereof.

The metal plate 21 has four metal leads 22, 23, 24 and 25 at the bottom surface thereof which are arranged along the periphery of the plate 21 at almost regular intervals. The top ends of the leads 22, 23, 24 and 25 are fixed to the plate 21, respectively. All the leads 22, 23, 24 and 25 are of columnar shapes.

The top end of the lead 25 is electrically connected to the metal plate 21 and does not protrude from the top surface of the plate 21. The top ends of the leads 22, 23 and 24 are electrically insulated from the metal plate 21 and slightly pass through the plate 21 to protrude from the top surface thereof. As shown in FIG. 1A, the top end of the lead 24 is formed to a flat, thin plate 24a.

A semiconductor laser 27 as a light-emitting element is adhered to be fixed on a heat sink 26 which is fixed to the flat element-mount face 34a of the block 34. The heat sink 26 is made of insulating material and the mounting surface thereof is covered with a metal layer electrically connected to the block 34 by a piece 31 of bonding wire. The laser 27 is mounted on the mounting surface of the heat sink 26.

The anode of the laser 27 is in contact with the metal layer of the heat sink 26 so that it is electrically connected to the metal plate 21 and the lead 25 through the piece 31 of bonding wire and the metal block 34. The cathode of the laser 27 is electrically connected to the protruded top end 24a of the lead 24 by a piece 30 of bonding wire.

A photodiode 29 as a light-receiving element is adhered to be fixed on a rectangular alumina plate 28. The alumina plate 28 is fixed on the top surface of the metal plate 21 through an insulator. The photodiode 29 receives to monitor the light emitted from the laser 27.

The cathode of the photodiode 29 is in contact with the alumina plate 28 and the plate 28 is electrically connected to the top end of the lead 22 by a piece 32 of bonding wire, and as a result, the cathode is electrically connected to the lead 22. The anode of the photodiode 29 is electrically connected to the protruded to pend of the lead 23 by a piece 33 of bonding wire. The photodiode 29 itself is electrically insulated from the metal plate 21.

The electrical connections of the optoelectronic device described above is shown in FIG. 1B. The semiconductor laser 27 is driven by a dc voltage applied across the leads 24 and 25 and the photodiode 29 is driven by a driver circuit (not shown) connected to the leads 22 and 23.

Another conventional optoelectronic device of this sort is shown in FIGS. 2A and 2B.

The optoelectronic device shown in FIG. 2A is the same in structure as that shown in FIG. 1A excepting that a piece 31a of bonding wire is provided for electrically connecting the top end of the lead 22 and the heat sink 26 instead of the piece 31 of bonding wire bonded to the metal block 34 and the heat sink 26.

Therefore, the anode of the semiconductor laser 29 is electrically connected to the cathode of the photodiode 29 by the piece 31a of bonding wire. The anode of the semiconductor laser 29 is electrically insulated from the metal plate 21.

This optoelectronic device has electrical connections as shown in FIG. 2B.

The market mostly has been demanding the electrical connections in FIG. 1B, however, recently, it is demanding those in FIG. 2B increasingly.

With the conventional optoelectronic device shown in FIG. 2B, the electrical connections are performed by the following bonding sequence:

First, an end of a continuous bonding wire is bonded to the top end of the lead 23 by a wire bonding machine, and the continuous bonding wire is then bonded to the anode of the photodiode 29 to be cut. Thus, the top end of the lead 23 is linked with the anode of the photodiode 29 by the piece 33 of bonding wire.

Next, the end of the continuous bonding wire is bonded to the alumina plate 28, and the continuous bonding wire is then bonded to the top end of the lead 22. Thus, the cathode of the photodiode 29 is linked with the top end of the lead 22 by the piece 32 of bonding wire.

The continuous bonding wire is further bonded to the heat sink 26 fixed to the element-mounting surface 34a of the block 34 to be cut. Thus, the top end of the lead 22 is linked with the anode of the semiconductor laser 27 by the piece 31a of bonding wire.

Finally, the end of the continuous bonding wire is bonded to the anode of the semiconductor laser 27, and the continuous bonding wire is then bonded to the top end 24a of the lead 24 to be cut. Thus, the cathode of the laser 27 is linked with the top end 24a of the lead 24 by the piece 30 of bonding wire.

In this bonding sequence, there is a problem that the bonding head of the wire bonding machine and the plate 21 are required to be turned by 90 degrees in the step of forming the piece 31a of bonding wire, respectively.

In this step, the bonding face or the anode surface of the semiconductor laser 27 is oriented horizontally and the bonding face or the top end face of the lead 22 is oriented upward. Therefore, these two bonding faces are perpendicular to each other. Also, the positions of the bonding faces thereof are apart from each other along the surface of the plate 21.

As a result, the bonding head oriented downward in the bonding step of the lead 22 is required to be turned by 90 degrees to be oriented horizontally, and at the same time, the plate 21 is turned by 90 degrees around its central axis so that the bonding face of the laser 27 is placed at a given bonding position of the wire bonding machine in the step of forming the piece 31a of bonding wire.

Generally, when the wire bonding processes are performed between the perpendicular surfaces, the obtainable bonding strength is remarkably reduced compared with the case that the processes are performed between the parallel surfaces, and as a result, it is difficult for sufficient bonding reliability to be ensured, resulting in less reliability of the optoelectronic device shown in FIGS. 2A and 2B.

Additionally, there is another problem that the working table of the wire bonding machine has to be equipped with a turning mechanism during a bonding process, which produces increase in cost.

To solve the above problems, a conventional optoelectronic device as shown in FIG. 3 has been developed, which was disclosed in the JAPANESE NON-EXAMINED PATENT PUBLICATION NO. 2-86184.

As shown in FIG. 3, on a circular metal plate 41 as a base, there is a rectangular parallelepiped metal block 54 as an element mount. A semiconductor laser 47 as a light-emitting element is adhered to be fixed on a flat side face of the block 54. The block 54 also acts as a heat sink for the laser 47.

The metal plate 41 has three metal leads 42, 43 and 45 arranged at the bottom surface thereof at intervals. The top ends of the leads 42, 43 and 45 are fixed to the plate 41 electrically insulated from the plate 41 by glass films 60, respectively. All the leads 42, 43 and 45 are of columnar shapes.

The top end of the lead 45 does not protrude from the top surface of the plate 41. The top ends of the leads 42 and 43 slightly pass through the plate 41 to protrude from the top surface thereof. Bonding faces 42a and 43a are produced on the top end faces of the leads 42 and 43, respectively.

There is a rectangular parallelepiped insulator block 62 adjacent to the metal block 54 on the top surface of the plate 41. The insulator block 62 is made of ceramic such as alumina ($Al_2O_3$), SiC, $ZiO_2$, $Si_3O_4$. A metal layer 63 is formed on the insulator block 62 by a metallization process. The layer 63 extends from a top face of the block 62 to a side face thereof.

The flat top face of the insulator block 62 is substantially the same in height as the flat top face of the metal block 54, and both of the top faces are parallel to each other. The flat side face metallized of the insulator block 62 and the anode and cathode surfaces of the laser 47 are parallel to each other.

The anode surface of the laser 47 is in contact with the side face of the metal block 54 to be electrically connected to the metal block 54, and the cathode surface thereof is electrically connected to the metal layer 63 at the side face of the insulator block 62 by a piece 51 of bonding wire. The metal layer 63 is electrically connected to the bonding face 42a of the lead 42 at the side face of the insulator block 62 by a piece 64 of bonding wire.

A photodiode 49 as a light-receiving element is adhered to be fixed on the top surface of the plate 41 adjacent to the metal block 54. The cathode surface of the photodiode 49 is in contact with the top surface of the metal plate 41 to be electrically connected to the plate 41, and the anode surface thereof is electrically connected to the bonding face 43a of the lead 43 by a piece 53 of bonding wire.

The electrical connections of the optoelectronic device in FIG. 3 is the substantially same as that shown in FIG. 2B.

With the optoelectronic device in FIG. 3, although the above problems can be solved, there arises a different problem that the metal layer 63 needs to be formed and patterned on the insulator block 62 and that the insulator block 62 thus metallized needs to be fixed on the metal plate 41.

This means that the number of the assembly process steps is increased and the optoelectronic device thus assembled is more complex in structure compared with the conventional ones in FIGS. 2A and 3A, producing increase in cost.

SUMMARY OF THE INVENTION

Accordingly, an object of the present invention is to provide an optoelectronic device of the above sort in which sufficient bonding reliability can be ensured without increase in number of assembly process steps and in complexity in structure compared with the conventional ones.

Another object of the present invention is to provide an optoelectronic device of the above sort which requires no turning mechanism of the working table for the wire bonding machine that enables the working table to turn during a bonding process.

An optoelectronic device according to the present invention contains a base plate and a first lead fixed to the base plate.

There are a first bonding face for a light-emitting element fixed to the base plate and a second bonding face for a light-receiving element fixed to the base plate. The first bonding face is oriented a first direction and a second bonding face is oriented a second direction different from the first direction.

A top end part of the first lead passes through the base plate and protrudes from the base plate. The top end part has a third bonding face and a fourth bonding face, and third bonding face being oriented the first direction and the fourth bonding face being oriented the second direction.

One end of a first piece of bonding wire is bonded to the first bonding face and the other end thereof is bonded to the third bonding face. One end of a second piece of bonding wire is bonded to the second bonding face and the other end thereof is bonded to the fourth bonding face.

With the optoelectronic device according to the present invention, since the top end part of the first lead has the third bonding face oriented the same direction as the first bonding face and the fourth bonding face oriented the same direction as the second bonding face. Therefore, the first piece of bonding wire can be bonded to the first and third bonding faces having the same direction and the second piece of bonding wire can be bonded to the second and fourth bonding faces having the same direction.

Accordingly, the wire bonding processes of the first and second pieces of bonding wire are performed between the parallel bonding faces, and as a result, sufficient bonding reliability can be ensured, providing sufficient reliability of the optoelectronic device.

Also, since no patterned metal layer and no insulator block needs to be provided, the number of the assembly process steps is not increased and the optoelectronic device thus assembled does not become complex in structure compared with the conventional ones.

Further, since the wire bonding processes of the first and second pieces of bonding wire are performed between the parallel bonding faces, no turning mechanism of the working table for the wire bonding machine that enables the working table to turn during a bonding process is required.

DESCRIPTION OF THE PREFERRED EMBODIMENTS

Preferred embodiments of the present invention will be described below while referring to FIGS. 4, 5A, 5B, 5C and 5D.

FIRST EMBODIMENT

Figure 4A:
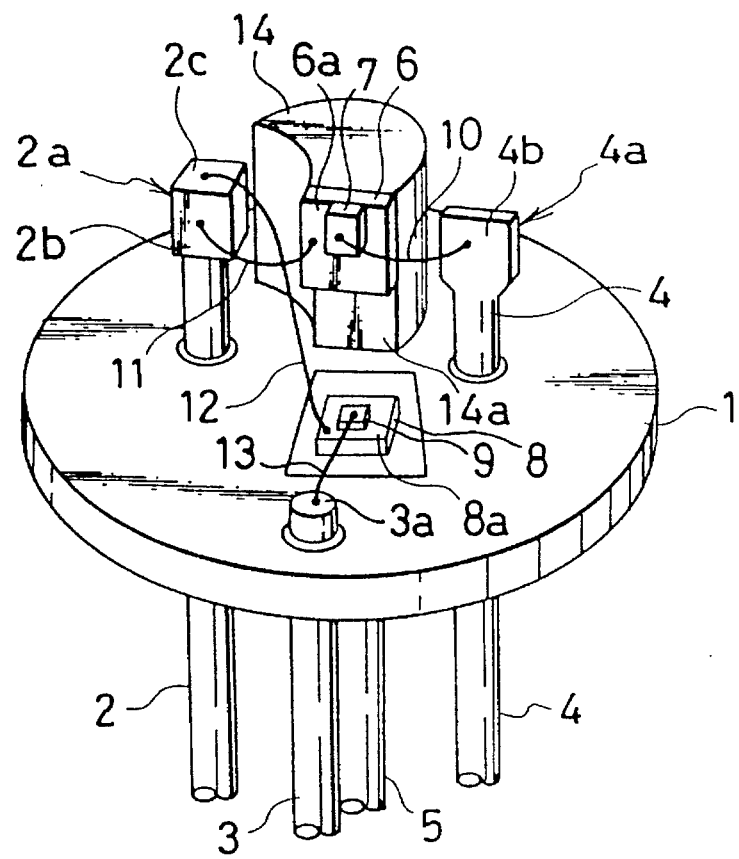
FIG. 4A is a perspective view showing the structure of an optoelectronic device according to a first embodiment of the present invention.

In FIG. 4, an optoelectronic device of a first embodiment has a metal stem composed of a circular metal plate 1 as a base and a metal block 14 as an element mount placed on the top surface of the plate 1. The block 14 is fixed on the metal plate 1 or is integrated with the plate 1. The block 14 has a horizontal cross-section of an arc and a flat element-mount face 14a at one side thereof.

The metal plate 1 has four metal leads 2, 3, 4 and 5 at the bottom surface thereof which are arranged along the periphery of the plate 1 at almost regular intervals. The top ends of the leads 2, 3, 4 and 5 are fixed to the plate 1, respectively. All the leads 2, 3, 4 and 5 are of columnar shapes.

A semiconductor laser 7 as a light-emitting element is adhered to be fixed on a heat sink 6 which is fixed to the flat element-mount face 14a of the metal block 14. The heat sink 6 is made of insulating material and a mounting surface 6a thereof is covered with a metal layer. The mounting surface 6a acting as a bonding face is perpendicular to the top surface of the metal plate 1.

The laser 7 is mounted on the mounting surface 6a so that the anode surface of the laser 7 is in contact with the metal layer formed on the surface 6a. The anode surface is parallel to the mounting surface 6a. The cathode surface of the laser 7 is also parallel to the mounting surface 6a.

A photodiode 9 as a light-receiving element is adhered to be fixed on a rectangular alumina plate 8 which is fixed on the top surface of the metal plate 1. Therefore, the photodiode 9 itself is electrically insulated from the plate 1. The photodiode 9 receives to monitor the light emitted from the laser 7.

The top surface 8a of the plate 8 is covered with a metal layer and acts as a bonding face thereof. The cathode surface of the photodiode 9 is in contact with the metal layer of the bonding face 8a. The bonding face 8a is parallel to the top surface of the metal plate 1. The anode surface of the photodiode 9 is also parallel to the top surface of the plate 1.

The top end 2a of the lead 2 is electrically insulated from the metal plate 1 and pass through the plate 1 to protrude from the top surface thereof. The top end 2a of the lead 2 is formed to a cube and has bonding faces 2b and 2c perpendicular to each other. The bonding face 2b is perpendicular to the top surface of the plate 1 and is parallel to the bonding face 6a of the heat sink 6. The bonding face 2c is parallel to the top surface of the plate 1 and is perpendicular to the bonding face 6a of the heat sink 6.

The top end 3a of the lead 3 is also electrically insulated from the metal plate 1 and slightly pass through the plate 1 to protrude from the top surface thereof. The top end face 3a is a bonding face parallel to the top surface of the plate 1 and to the anode surface of the photodiode 9.

The top end 4a of the lead 4 is also electrically insulated from the metal plate 1 and pass through the plate 1 to protrude from the top surface thereof. The top end 4a of the lead 4 is formed to a flat, thin plate and has a bonding face 4b. The bonding face 4b is perpendicular to the top surface of the plate 1 and is parallel to the bonding face 2b of the lead 2, the bonding face 6a of the heat sink 6 and the cathode surface of the semiconductor laser 7.

The top end of the lead 5 is electrically connected to the metal plate 1 and does not protrude from the top surface of thereof.

The bonding face 2b of the lead 2 and the bonding face 6a of the heat sink 6, which are parallel to each other and perpendicular to the top surface of the metal plate 1, are electrically connected to each other by a piece 11 of bonding wire.

The anode surface of the semiconductor laser 7 and the bonding face 4b of the lead 4, which are parallel to each other and perpendicular to the top surface of the metal plate 1, are electrically connected to each other by a piece 10 of bonding wire.

The anode surface of the photodiode 9 and the bonding face 3a of the lead 3, which are parallel to each other and parallel to the top surface of the metal plate 1, are electrically connected to each other by a piece 13 of bonding wire.

The bonding face 2c of the lead 2 and the bonding face 8a of the alumina plate 8, which are parallel to each other and parallel to the top surface of the metal plate 1, are electrically connected to each other by a piece 12 of bonding wire.

Figure 2A:
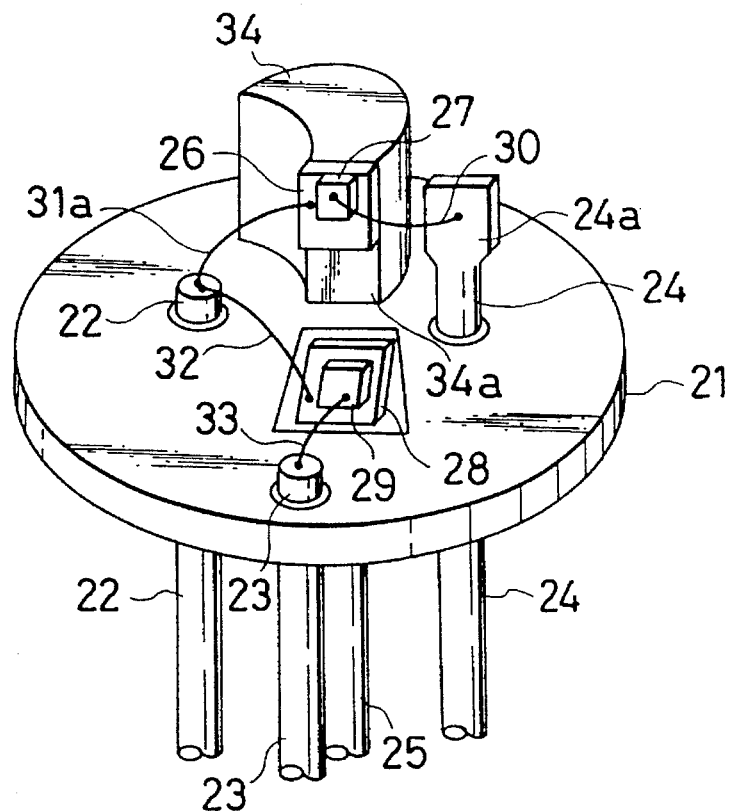
FIG. 2A is a perspective view showing the structure of another conventional optoelectronic device.
Figure 2B:
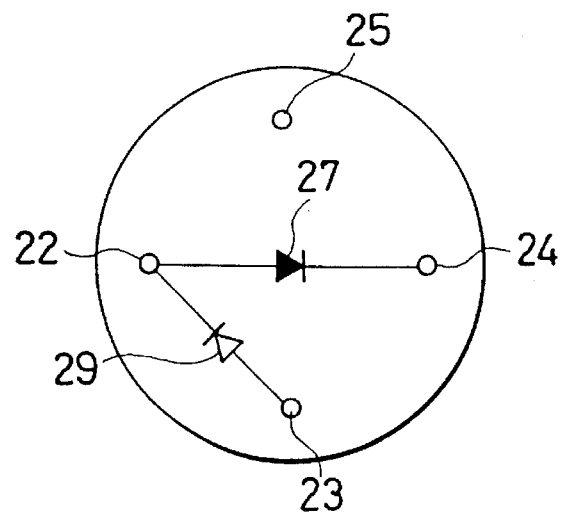
FIG. 2B is a schematic view showing the electrical connections of the conventional optoelectronic device shown in FIG. 2A.

The electrical connections of the optoelectronic device described above is shown in FIG. 4B, which is the same as that of FIG. 2B. The cathode of the semiconductor laser 7 is connected to the lead 4 and the anode thereof is connected to the lead 2. The cathode of the photodiode 9 is connected to the lead 2 and the anode thereof is connected to the lead 3.

For example, the leads 2, 3, 4 and 5 are made of any metal such as 50%Ni-Fe alloy and the diameters of which may be 0.45 mm. In this case, each side of the cubic top end 2a of the lead 2 may be 0.5 mm in length.

With the optoelectronic device of the first embodiment, the electrical connections are performed using a wire bonding machine by the following bonding sequence:

After fixing the semiconductor laser 7 and the photodiode 9 to the metal block 14 and the metal plate 1, respectively, first, an end of a continuous bonding wire is bonded to the bonding face 2a of the lead 2, and the continuous bonding wire is then bonded to the bonding face 8a of the alumina plate 8 to be cut. Thus, the top end part 2a of the lead 2 is linked with the alumina plate 8 by the piece 12 of bonding wire.

Second, an end of the continuous bonding wire is bonded to the cathode surface of the photodiode 9, and the continuous bonding wire is then bonded to the bonding face 3a of the lead 3 to be cut. Thus, the cathode of the photodiode 9 is linked with the top end of the lead 3 by the piece 13 of bonding wire.

Third, an end of the continuous bonding wire is further bonded to the bonding face 2b of the lead 2, and the continuous bonding wire is then bonded to the bonding face 6a of the heat sink 6 to be cut. Thus, the top end part 2a of the lead 2 is linked with the heat sink 6 by the piece 11 of bonding wire.

Finally, an end of the continuous bonding wire is bonded to the cathode surface of the semiconductor laser 7, and the continuous bonding wire is then bonded to the bonding face 4a of the lead 4 to be cut. Thus, the cathode of the laser 7 is linked with the top end part 4a of the lead 4 by the piece 10 of bonding wire.

In this bonding sequence, since all the first to fourth bonding steps described above are carried out between two parallel bonding faces, sufficient bonding reliability can be ensured, providing sufficient reliability of this optoelectronic device.

Generally, when a wire bonding process is performed between parallel bonding faces, obtainable bonding strength is always approximately 6 g; on the other hand, when a wire bonding process is performed between perpendicular bonding faces with turning bonding wire by 90 degrees, obtainable bonding strength is remarkably reduced.

For example, obtainable bonding strength decreases to 4 g or less at the rate of about 10%. Therefore, sufficient reliability in wire bonding is difficult to be obtained.

However, with the optoelectronic device of the first embodiment, bonding strength of about 6 g can be obtained stably.

Figure 3:
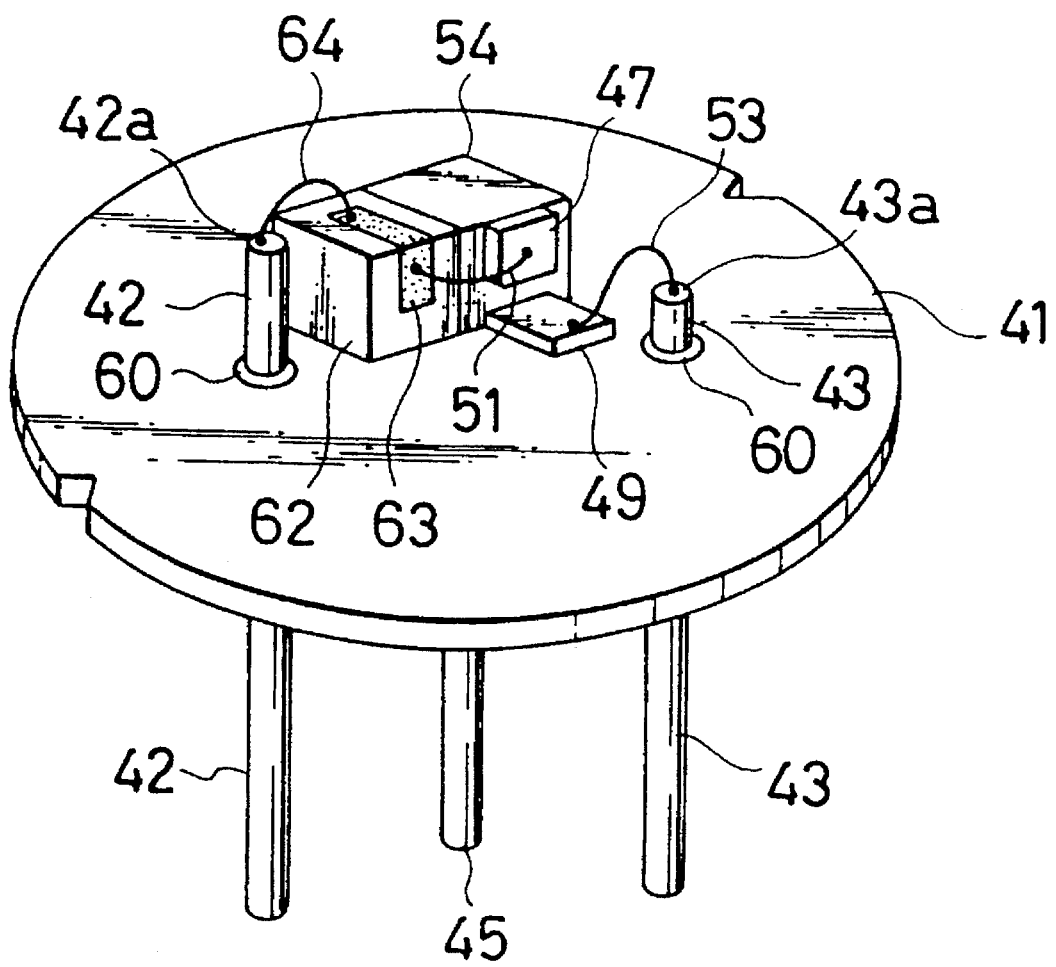
FIG. 3 is a perspective view showing the structure of still another conventional optoelectronic device.

There is an additional advantage that the shape of metal block 14 does not need to be changed as in the conventional optoelectronic device shown in FIG. 3 and that no relay member or part such as the insulator block 62 in the conventional optoelectronic one in FIG. 3 is required.

SECOND EMBODIMENT

FIG. 6A shows a lead 72 of an optoelectronic device according to a second embodiment. The lead 72 is the same in structure as the lead 2 of the first embodiment other than that the shape of a top end part 72a is rectangular parallelepiped.

Bonding faces 72b and 72c of the lead 72 correspond to the bonding faces 2b and 2c of the first embodiment, respectively.

THIRD EMBODIMENT

Figure 5A:
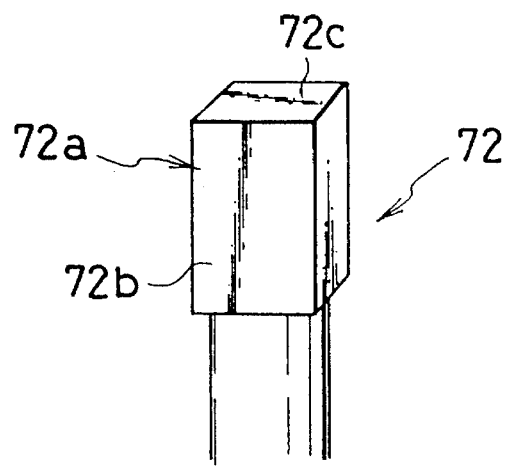
FIG. 5A is a perspective view of a lead of an optoelectronic device of a second embodiment of the present invention.
Figure 5B:
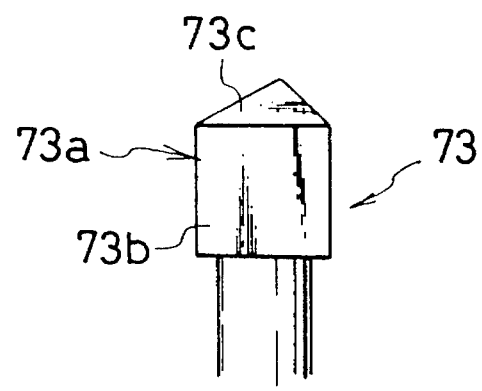
FIG. 5B is a perspective view of a lead of an optoelectronic device according to a third embodiment of the present invention.
Figure 5C:
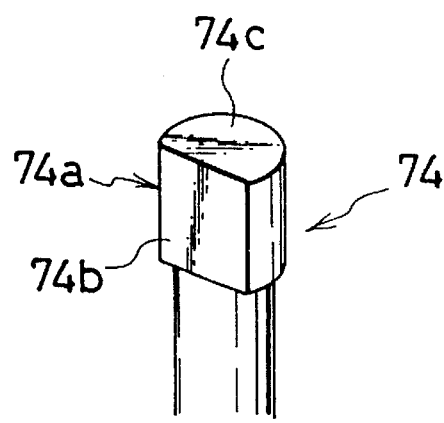
FIG. 5C is a perspective view of a lead of an optoelectronic device according to a fourth embodiment of the present invention.

FIG. 5B shows a lead 73 of an optoelectronic device according to a third embodiment. The lead 73 is the same in structure as the lead 2 of the first embodiment other than that the shape of a top end part 73a is a pillar with a triangular cross-section.

Bonding faces 73b and 73c of the lead 73 correspond to the bonding faces 2b and 2c of the first embodiment, respectively.

FOURTH EMBODIMENT

FIG. 5A shows a lead 74 of an optoelectronic device according to a fourth embodiment. The lead 74 is the same in structure as the lead 2 of the first embodiment other than that the shape of a top end part 74a is a pillar with a semicircular cross-section.

Bonding faces 74b and 74c of the lead 74 correspond to the bonding faces 2b and 2c of the first embodiment, respectively.

FIFTH EMBODIMENT

Figure 5D:
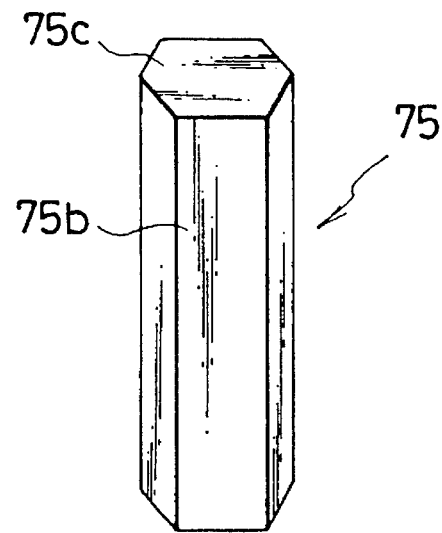
FIG. 5D is a perspective view of a lead of an optoelectronic device according to a fifth embodiment of the present invention.

FIG. 5D shows a lead 75 of an optoelectronic device according to a fifth embodiment. The lead 75 is the same in structure as the lead 2 of the first embodiment other than that the entire shape of the lead 75 is a pillar with a hexagonal cross-section.

Bonding faces 75b and 75c of the lead 75 correspond to the bonding faces 2b and 2c of the first embodiment, respectively.

Any pillar with the other polygonal cross-section than the hexagonal one may be applied.

Figure 1A:
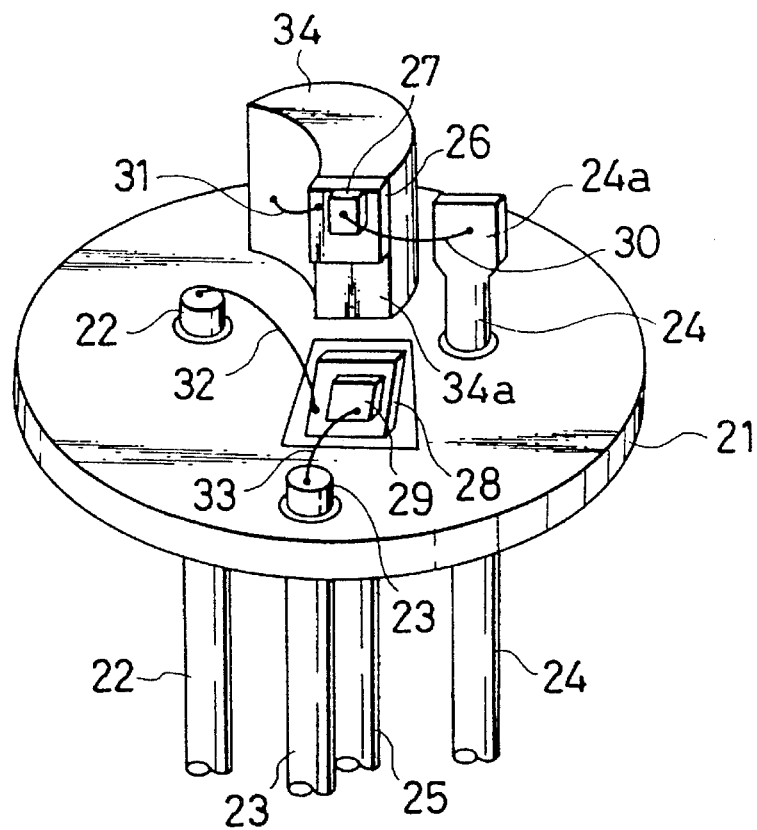
FIG. 1A is a perspective view showing the structure of a conventional optoelectronic device.
Figure 1B:
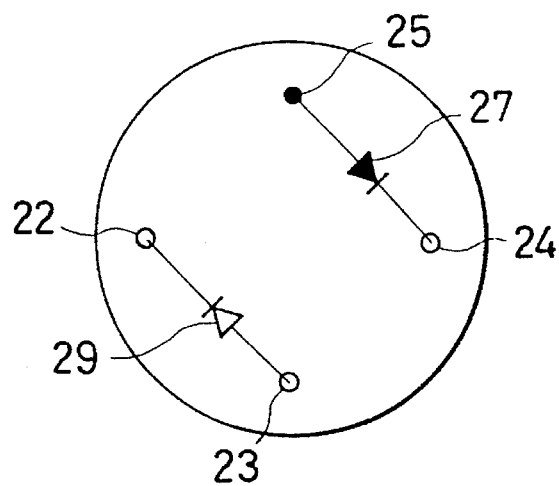
FIG. 1B is a schematic view showing the electrical connections of the conventional optoelectronic device shown in FIG. 1A.
Figure 4B:
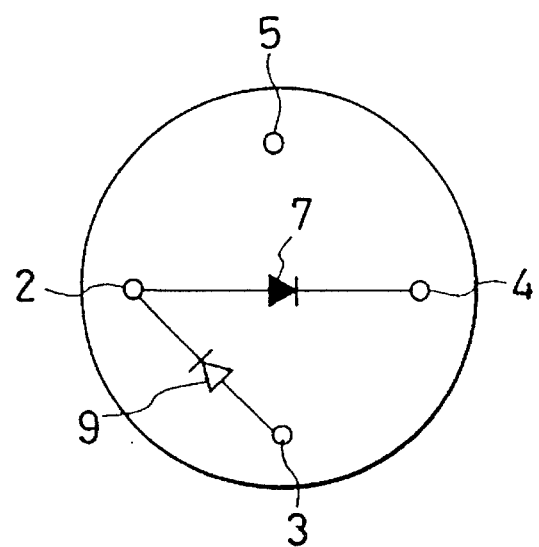
FIG. 4B is a schematic view showing the electrical connections of the optoelectronic device of the first embodiment.

The above embodiments have the electrical connections as shown in FIG. 4B, however, any other electrical connections such as that in FIG. 1B may be used. The number of leads, the sorts of the light-emitting and light-receiving elements may be changed. The top end part 4a of the lead 4 may be the same as the top end part 2a of the lead 2.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A optoelectronic device comprising:

a base plate;

a first bonding face for a light-emitting element fixed to said base plate;

said first bonding face being oriented in a first direction;

a second bonding face for a light-receiving element fixed to said base plate;

said second bonding face being oriented in a second direction different from said first direction;

a first lead fixed to said base plate;

a top end part of said first lead passing through said base plate and protruding from said base plate;

said top end part having a third bonding face and a fourth bonding face;

said third bonding face being oriented in said first direction;

said fourth bonding face being oriented in said second direction;

a first piece of bonding wire, one end of said first piece of bonding wire being bonded to said first bonding face and the other end thereof being bonded to said third bonding face; and a second piece of bonding wire, one end of said second piece of bonding wire being bonded to said second bonding face and the other end thereof being bonded to said fourth bonding face.

2. The optoelectronic device as claimed in claim 1, wherein said top end part of said first lead is a pillar with a polygonal cross-section, said third bonding face being a side face perpendicular to said base plate and said fourth bonding face being a top face parallel to said base plate.

3. The optoelectronic device as claimed in claim 1, wherein a shape of said top end part of said first lead is one of a cubic parallelepiped and a rectangular parallelepiped, said third bonding face being a side face perpendicular to said base plate and said fourth bonding face being a top face parallel to said base plate.

4. The optoelectronic device as claimed in claim 1, wherein said top end part of said first lead is a pillar with an approximately semicircular cross-section, said third bonding face being a side face perpendicular to said base plate and said fourth bonding face being a top face parallel to said base plate.

5. The optoelectronic device as claimed in claim 1, further comprising:

a second lead fixed to said base plate;

a top end part of said second lead passing through said base plate and protruding from said base plate;

said top end part of said second lead having a fifth bonding face; and said fifth bonding face being parallel to one of said third and fourth bonding faces.

6. The optoelectronic device as claimed in claim 1, further comprising:

a metal block fixed to said base plate;

said metal block being used for fixing one of said light-emitting element and said light-receiving element to said base plate and the other thereof being fixed to said base plate; and said base plate and said metal block forming a stem.

7. The optoelectronic device as claimed in claim 6, wherein, said first and second directions are perpendicular to each other.

8. An optoelectronic device comprising:

a stem composed of a metal base plate and a metal block fixed to said base plate;

a heat sink fixed to said block;

a light-emitting element fixed to a bonding face of said heat sink, said bonding face being perpendicular to said base plate;

one of an anode and a cathode of said light-emitting element being in contact with said bonding face of said heat sink and the other thereof being parallel to said bonding face of said heat sink;

an insulator plate fixed to said base plate, said insulator plate having a bonding face parallel to said base plate;

a light-receiving element fixed to said bonding face of said insulator plate;

one of an anode and a cathode of said light-receiving element being in contact with said bonding face of said insulator plate and the other thereof being parallel to said bonding face of said insulator plate;

a first lead fixed to said base plate, a top end part of said first lead passing through said base plate and protruding from said base plate;

said top end part of said first lead having a pair of bonding faces, one of said pair of bonding faces being perpendicular to said base plate and the other thereof being parallel to said base plate;

a second lead fixed to said base plate, a top end part of said second lead passing through said base plate and protruding from said base plate;

said top end part of said second lead having a bonding face parallel to said base plate;

a third lead fixed to said base plate, a top end part of said third lead passing through said base plate and protruding from said base plate;

said top end part of said third lead having a bonding face perpendicular to said base plate;

a first piece of bonding wire, a first end of said first piece of bonding wire being bonded to said bonding face of said first lead perpendicular to said base plate, a second end of said first piece of bonding wire being bonded to said bonding face of said heat sink;

a second piece of bonding wire, a first end of said second piece of bonding wire being bonded to said bonding face of said first lead parallel to said base plate, a second end of said second piece of bonding wire being bonded to said bonding face of insulator plate;

a third piece of bonding wire, a first end of said third piece of bonding wire being bonded to one of an anode and a cathode of said light-emitting element, a second end of said third piece of bonding wire being bonded to said bonding face of said third lead;

a fourth piece of bonding wire, a first end of said fourth piece of bonding wire being bonded to one of an anode and a cathode of said light-receiving element, a second end of said fourth piece of bonding wire being bonded to said bonding face of said second lead.

9. The optoelectronic device as claimed in claim 8, wherein said top end part of said first lead is a pillar with a polygonal cross-section, said pair of bonding faces of said first lead being a side face thereof perpendicular to said base plate and a top face thereof parallel to said base plate.

10. The optoelectronic device as claimed in claim 8, wherein a shape of said top end part of said first lead is one of a cubic parallelepiped and a rectangular parallelepiped, said pair of bonding faces of said first lead being a side face thereof perpendicular to said base plate and a top face thereof parallel to said base plate.

11. The optoelectronic device as claimed in claim 8, wherein said top end part of said first lead is a pillar with an approximately semicircular cross-section, said pair of bonding faces of said first lead being a side face thereof perpendicular to said base plate and a top face thereof parallel to said base plate.

* * * * *